United States Patent [19]

Boyle

[11] Patent Number: 4,637,038

[45] Date of Patent: Jan. 13, 1987

[54] HIGH SPEED COUNTER

[75] Inventor: David H. Boyle, Manassas, Va.

[73] Assignee: International Business Machines Corporation, Armonk, N.Y.

[21] Appl. No.: 728,964

[22] Filed: Apr. 30, 1985

[51] Int. Cl.$^4$ ...................... H03K 23/60; H03K 23/62
[52] U.S. Cl. ..................................... 377/117; 377/111; 377/123
[58] Field of Search ............... 377/115, 116, 117, 111, 377/123, 125

[56] References Cited

U.S. PATENT DOCUMENTS

3,564,218 2/1971 Lay ...................................... 377/116
3,657,557 4/1972 Smith et al. .
3,906,195 9/1975 Maejima .............................. 377/125
3,943,378 3/1976 Beutler .
3,992,635 11/1976 Suzuki et al. .
4,037,085 7/1977 Minorikawa ......................... 377/116
4,464,774 8/1984 Jennings .
4,502,014 2/1985 Bismarck ............................. 377/111
4,587,665 5/1986 Minakuchi ........................... 377/123

Primary Examiner—John S. Heyman
Attorney, Agent, or Firm—John E. Hoel; H. St. Julian

[57] ABSTRACT

An M-bit binary counter is disclosed having M sequentially ascending binary value stages, the first stage being the lowest significant bit. In accordance with the invention, each stage above the least significant bit stage has a subsequent value decoder which has the function of determining the effect of lower order carry bits on higher order stages with a minimum of signal delay. The decoder includes the feature of using natural threshold FET devices in a transfer gate configuration to perform logical AND functions so as to minimize gate delays in decoding a carry condition for higher order stages. A selective up-counting or down-counting function is also disclosed.

8 Claims, 5 Drawing Figures

HIGH SPEED COUNTER

FIG. 1
HIGH SPEED COUNTER

FIG. 2

FIG. 3
SUBSEQUENT VALUE
DECODER 100C

FIG. 4
UP-DOWN SELECT LOGIC

FIG. 5
UP-DOWN SELECT CIRCUIT

HIGH SPEED COUNTER

BACKGROUND OF THE INVENTION

1. Technical Field

The Invention disclosed broadly relates to FET circuits and more particularly relates to improvements in FET binary counter circuits.

2. Background Art

Synchronous binary counters avoid rippling of a carry bit from a low order position to a higher order position by providing logic decoding at the inputs of the higher order positions which combine the presence of the input clocking signal with the condition of the lower order bits so as to determine whether the bit at a particular position should be changed. Prior art synchronous counters include those described in U. S. Pats. Nos. 3,992,635; 3,943,378; and 3,657,557. Although these prior art synchronous counters accomplish the function of anticipating the need for high order carry bits, circuit delays imposed by these circuits render them too slow for high speed counting applications.

To begin this description, several terms need to be defined and suitable abbreviations established. The N channel field effect transistor circuit technology will be the example used herein. The abbreviation "NFET" will be used herein to refer to an N channel field effect transistor device. Such devices are generally fabricated by forming an N-type conductivity source diffusion and N-type conductivity drain diffusion in the surface of a P-type conductivity silicon substrate. The channel region of the substrate separating the source and the drain regions is covered by a gate insulator layer and the gate electrode. An enhancement mode NFET is normally nonconducting between its source and drain and it can be switched into conduction by applying a positive potential to its gate electrode, with respect to the potential of it source electrode. A depletion mode NFET is normally coducting between its source and drain and it can be switched into nonconduction by applying a negative potential to its gate electrode, with respect to the potential of its source.

The threshhold potential for an FET device can be adjusted by means of ion implantation or other well-known techniques so that the potential difference between the gate and the source of the FET device can be selectively made more positive in the case of enhancement mode FET devices, or more negative in the case of depletion mode FET devices. If the threshhold voltage of an FET device is selectively adjusted so that conduction starts when there is no potential difference between the gate of the device and its source, then such a device is referred to as a zero threshold or "natural" threshold FET device.

When current is conducted from the drain to the source of an FET device, the electric potential at the source is reduced from the electric potential at the drain of the device by a quantity substantially equal to the threshold voltage for the device. Thus, for enhancement mode FET devices which typically have a threshold voltage of a positive one volt, when positive current is conducted from the positive drain to the less positive source of the device, the electric potential at the source is reduced from the electric potential at the drain of the device by a quantity of approximately one volt. In contrast, for a zero threshold or "natural" threshold FET device, when positive current is conducted from the drain to the source of the FET device, there is substantially no reduction in the electric potential at the source of the device.

Large scale integrated circuits and very large scale integrated circuits developed in the prior art have proved to be difficult to test because of embedded combinatorial logic positioned between sequential logic elements or latches. The prior art developed the technique of level sensitive scan design (LSSD) in order to test embedded combinatorial logic by means of selectively scanning in sequences of binary bit test patterns into an input latch stage, clocking the scanned-in data through the combinatorial logic for one cycle, and then scanning out the resultant binary bits from an output latch stage connected to the output of the combinatorial logic. This tecnhique has been described in detail, for example in U. S. Pats. Nos. 3,761,695; 3,783,254; and 3,806,891 by Eichelberger, all assigned to the IBM Corporation.

Occasionally herein it will be necessary to refer to binary logic variables and complementary binary logic variables. The use of the "*" notation herein following the expression for a binary logic variable, will indicate the binary complement of that variable. A positive logic convention will be used herein, where a more positive potential is considered representing a binary "1" value and a less positive potential is considered representing a binary "0" value.

OBJECTS OF THE INVENTION

It is therefore an object of the invention to provide an improved binary counting circuit.

It is another object of the invention to provide an improved synchronous binary counting circuit.

It is still a further object of the invention to provide an improved synchronous binary counting circuit capable of operating at higher speeds than has been available in the prior art.

SUMMARY OF THE INVENTION

These and other objects, features and advantages of the invention are accomplished by the high speed counter disclosed herein. An M-bit binary counter is disclosed having M sequentially ascending binary value stages, the first stage being the lowest significant bit. In accordance with the invention, each stage above the least significant bit stage has a subsequent value decoder which has the function of determining the effect of lower order carry bits on higher order stages with a minimum of signal delay. The principal elements of a subsequent value decoder will be described for such a decoder in a N+1st stage (where N is an integer and $0 < N < M$).

The decoder includes a first AND gate having a first input connected to a system input to be counted and a second input, and having an output. The first AND gate is a natural threshold FET device having its gate connected to the system input and its source-drain path connected between the second input and the output thereof. The use of a natural threshold FET device as an AND gate enables the propagation of a signal waveform along the source-drain path with an undiminished voltage amplitude and without the delay which accompanies conventional inverter-type AND gates.

The decoder further includes a latch having an input connected to the output of the first AND gate and having a true output Q(N+1) and a complementary output Q*(N+1), for storing the current binary state of the N+1st stage. The latch may be an edge triggered latch or it may be a master-slave latch.

The decoder further includes a second AND gate having a first input connected to the true output $Q(N+1)$ of the latch and a second input, and having an output connected to the second input of the first AND gate. The second AND gate is a natural threshold FET device having its gate connected to the true output $Q(N+1)$ of the latch and its source-drain path connected between the second input and the output thereof. The use of a natural threshold FET device as an AND gate enables the propagation of a signal waveform along the source-drain path with an undiminished voltage amplitude and without the delay which accompanies conventional inverter-type AND gates.

The decoder further includes a third AND gate having a first input connected to the complementary output $Q^*(N+1)$ of the latch and a second input and having an output connected to the second input of the first AND gate. The third AND gate is a natural threshold FET device having its gate connected to the complementary output $Q^*(N+1)$ of the latch and its source-drain path connected between the second input and the output thereof. The use of a natural threshold FET device as an AND gate enables the propagation of a signal waveform along the source-drain path with an undiminished voltage amplitude and without the delay which accompanies conventional inverter-type AND gates.

The decoder has a NOR gate having its output connected to the second input of the third AND gate, and having a plurality of N inputs, each respectively connected to the complementary output $Q^*(i)$ of a corresponding ith latch similar to the latch in the N+1st stage, in each of N lower order ones of the stages. A signal delay occurs in the NOR gate due to the necessity to charge or to discharge the output thereof in response to its inputs from the N lower order ones of the stages. However, the binary state of the complementary output $Q^*(N+1)$ of the latch is not delayed in this manner. The capacitance of the source-drain path of a natural threshold FET device is less than the capacitance of its gate electrode. This phenomenon is taken advantage of in the connection of the third AND gate, so that the lower capacitance source-drain path is connected to the delayed output of the NOR and the higher capacitance gate is connected to the lesser delayed complementary output $Q^*(N+1)$ from the latch. In this manner, the signals from the NOR gate and from the latch are juxtaposed in time and this contributes to the high speed operation of the subsequent value decoder.

The decoder also has an OR gate having its output connected to the second input of the second AND gate, and having a plurality of N inputs, each respectively connected to the complementary output $Q^*(i)$ of the corresponding ith latch similar to the latch in the N+1st stage, in each of the N lower order ones of the stages. A signal delay occurs in the OR gate due to the necessity to charge or to discharge the output thereof in resonse to its inputs from the N lower order ones of the stages. However, the binary state of the true output $Q(N+1)$ of the latch is not delayed in this manner. The capacitance of the source-drain path of a natural threshold FET device is less than the capacitance of its gate electrode. This phenomenon is taken advantage of in the connection of the second AND gate, so that the lower capacitance source-drain path is connected to the delayed output of the OR and the higher capacitance gate is connected to the lesser delayed true output $Q(N+1)$ from the latch. In this manner, the signals from the OR gate and from the latch are juxtaposed in time and this contributes to the high speed operation of the subsequent value decoder.

In this manner, the effect of lower order carry bits on higher order stages can be quickly decoded with a minimum of signal delay.

As an additional feature, the NOR gate further includes a first depletion mode FET load device connected between a positive reference potential and the output of the NOR gate. Still further, the NOR gate includes a plurality of N enhancement mode FET devices each having its respective source-drain path connected between the output of the NOR gate and ground potential and each having its respective gate connected to the complementary output $Q^*(i)$ of the corresponding ith latch similar to the latch in the N+1st stage, in each of the N lower order ones of the stages.

In another feature, the OR gate further includes a second depletion mode FET load device connected between the ground potential and the output of the OR gate. Still further, the OR gate includes a plurality of N natural threshold FET devices, each having its respective source-drain path connected between the output of the OR gate and the positive reference potential and each having its respective gate connected to the complementary output $Q^*(i)$ of the corresponding ith latch similar to the latch in the N+1st stage, in each of the N lower order ones of the stages.

The resultant circuit provides a minimum signal path between lower order and higher order stages in the counter in order to enable higher speed counting operations.

DESCRIPTION OF THE FIGURES

These and other objects, features and advantages of the invention will be more fully appreciated with reference to the accompanying figures.

DISCUSSION OF THE PREFERRED EMBODIMENT

Figure 1:
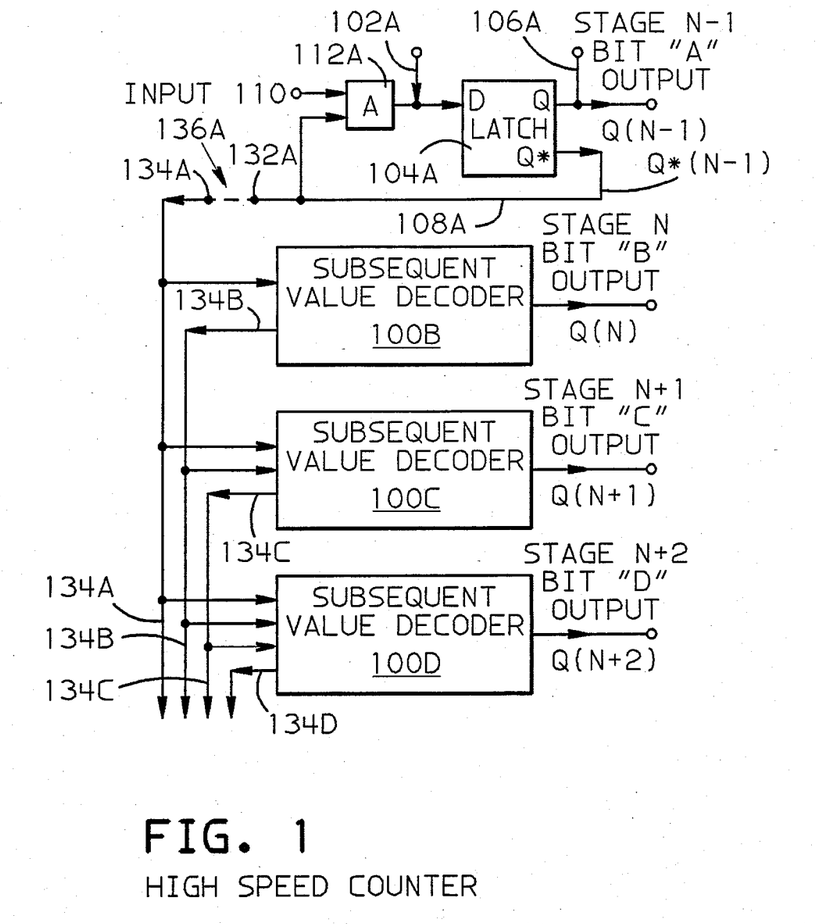
FIG. 1 is a block diagram of the high speed counter invention.
Figure 2:
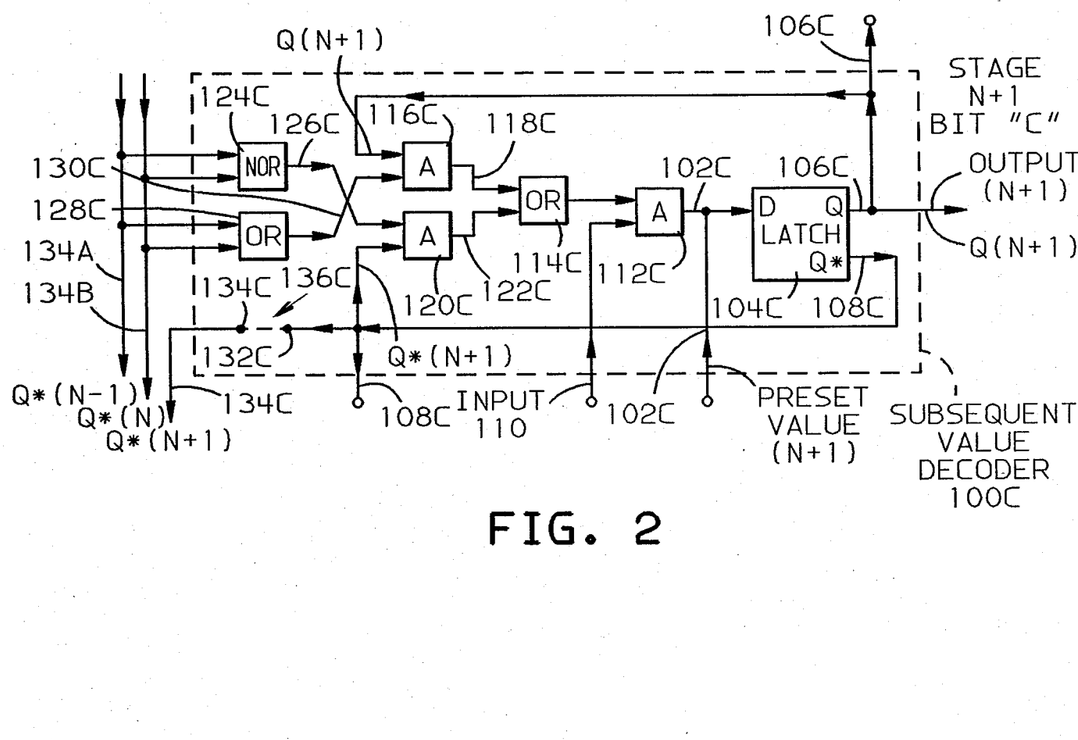
FIG. 2 is a logic diagram of the subsequent value decoder 100C. There are three subsequent value decoders, 100B, 100C and 100D, shown in FIG. 1 and the structure and operation of the decoder 100C shown in FIG. 2 is identical to that for the decoders 100B and 100D. A subsequent value decoder such as 100C of FIG. 2 is included in each stage of the counter of FIG. 1 above the lowest significant bit.

An M-bit binary counter is disclosed in the block diagram of FIG. 1, having M sequentially ascending binary value stages, the first stage being the lowest significant bit. In FIG. 1, M has the value of four. In accordance with the invention, each stage above the least significant bit stage has a subsequent value decoder which has the function of determining the effect of lower order carry bits on higher order stages with a minimum of signal delay. FIG. 2 is a logic diagram of the subsequent value decoder 100C. There are three subsequent value decoders, 100B, 100C and 100D, shown in FIG. 1 and the structure and operation of the decoder 100C shown in FIG. 2 is identical to that for the decoders 100B and 100D. A subsequent value decoder such as 100C of FIG. 2 is included in each stage of the counter of FIG. 1 above the lowest significant bit.

The principal elements of a subsequent value decoder will be described for the decoder 100C in the N+1st stage (where N is an integer and $0 < N < M$). In FIG. 1, N has the value of 2. The subsequent value decoder 100C corresponds to the "C" bit which is the third least significant bit in the counter of FIG. 1. All of the reference numbers of the elements in the decoder 100C have the suffix "C". Corresponding elements in the structure of the decoders 100B and 100D are identical to those for decoder 100C and when they are referred to they will have the suffix "B" or "D", respectively. Elements referred to in the least significant bit stage N−1 of FIG. 1, will have the suffix "A" corresponding to the "A" bit which is generated by that stage.

FIG. 2 shows the decoder 100C which includes a first AND gate 112C having a first input connected to a system input 110 to be counted and a second input (from OR gate 114C), and having an output 102C. The system input 110, which is a sequence of positive pulses to be counted, is applied to the corresponding AND gate 112A, 112B, 112C and 112D in each respective stage N−1 to N+2 of the counter of FIG. 1.

Figure 3:
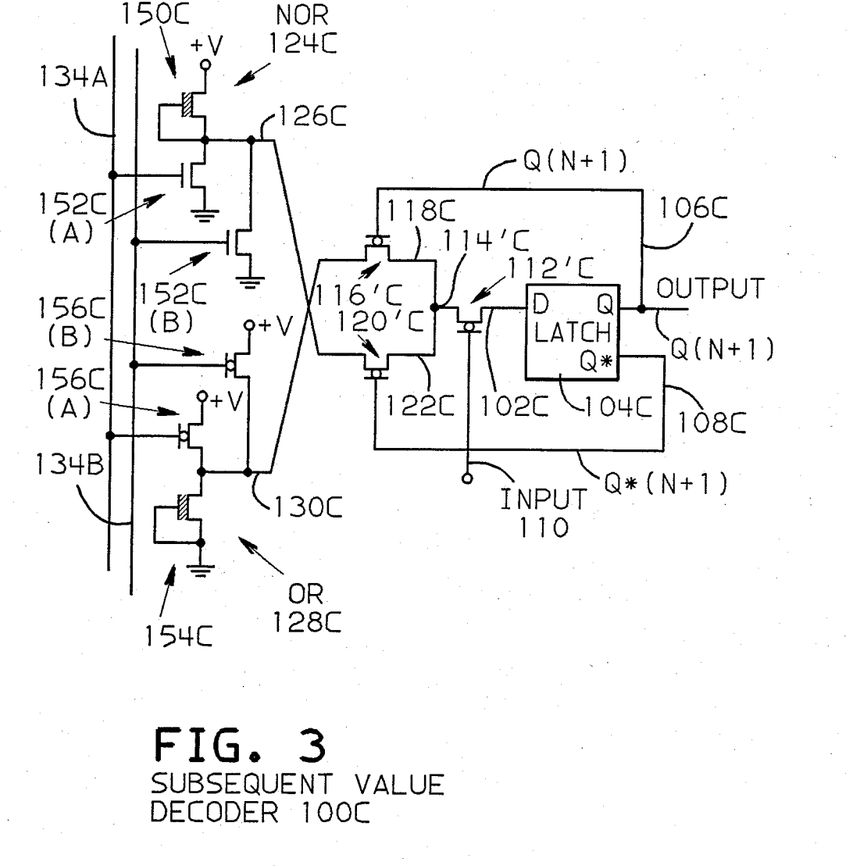
FIG. 3 is a circuit diagram of the subsequent value decoder 100C of FIG. 2.

The circuit diagram of FIG. 3 shows the first AND gate 112C being a natural threshold FET device 112'C having its gate connected to the system input 110 and its source-drain path connected between the second input (the OR gate 114C) and the output 102C thereof. The use of a natural threshold FET device as an AND gate enables the propagation of a signal waveform along the source-drain path with an undiminished voltage amplitude and without the delay which accompanies conventional inverter-type AND gates.

FIGS. 2 and 3 show a latch 104C having an input (D) connected to the output 102C of the first AND gate 112C, and having a true output Q(N+1) 106C and a complementary output Q*(N+1) 108C, for storing the current binary state of the N+1st stage. The latch may be an edge triggered latch or it may be a master-slave latch.

The current binary state stored in the latch 104C represents the current binary value for the bit "C" in stage N+1of the counter. A knowledge of this binary state must be provided to the higher order stages N+2, etc. so that on the next occurance of an input pulse to be counted at the input 110 of every stage, each higher order stage will be ready to change its respective binary state, if necessary. This is provided by passing either the true value Q(N+1) or the complementary value Q(N+1) from the latch 104C in stage N+1, out onto the line 134C to all stages in the counter greater than N+1. If the counter of FIG. 1 is to count in a decreasing sequence as a down counter, then it is the true value Q(N+1) which is output on line 134C. If the counter of FIG. 1 is to count in an increasing sequence as an up-counter, then it is the complementary value Q*(N+1) which is output on line 134C.

Figure 4:
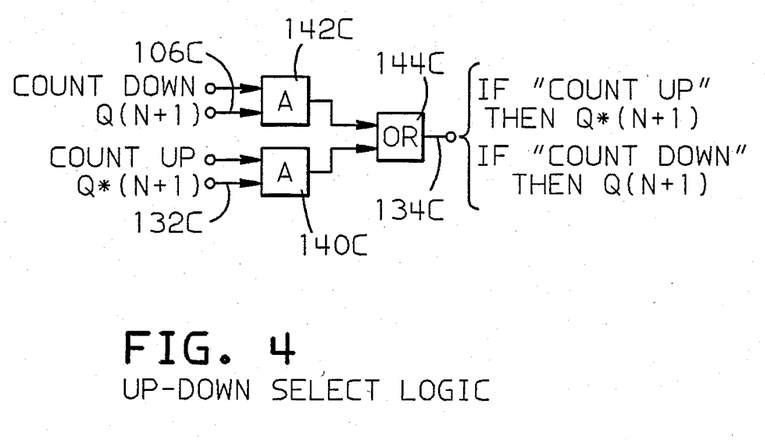
FIG. 4 is a logic diagram of the up-down select logic which can be substituted at 136C in FIG. 2 and at 136A in FIG. 1. The logic of FIG. 4 can be used in association with each subsequent value decoder in FIG. 1 to enable the selective setting of the counter as either an up-counter or a down-counter.
Figure 5:
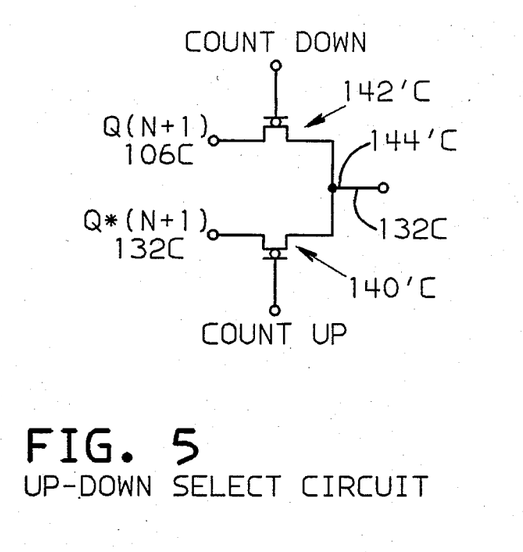
FIG. 5 is a circuit diagram of the up-down select logic of FIG. 4.

In order to simplify the explanation of the operation of the subsequent value decoder 100C, it is depicted in FIG. 2 as an up-counter, by providing a shorted connection 136C between the terminal 132C and line 134C so that the complementary value Q*(N+1) is output. However, the up-down select logic shown in FIGS. 4 and 5 can be substituted for the shorted connection 136C to provide for selectively setting the counter of FIG. 1 as either an up-counter or a down-counter. FIG. 4 is a logic diagram of the up-down select logic which can be substituted at 136C in FIG. 2 and at 136A in FIG. 1. The logic of FIG. 4 can be used in association with each subsequent value decoder in FIG. 1 to enable the selective setting of the counter as either an up-counter or a down-counter. FIG. 5 is a circuit diagram of the up-down select logic of FIG. 4.

An initial binary value for bit "C" can be loaded into the latch 104C by means of the present value N+1terminal at 102C in FIG. 2. This terminal can also be used as the scan input terminal for level sensitive scan design testing.

FIG. 2 shows a second AND gate 116C having a first input connected to the true output Q(N+1) 106C of the latch 104C and a second input 130C, and having an output connected to the second input (through the OR gate 114C) of the first AND gate 112C.

FIG. 3 shows the second AND gate 116C being a natural threshold FET device 116'C having its gate connected to the true output Q(N+1) 106C of the latch 104C and its source-drain path connected between the second input 130C and the output 118C thereof. The use of a natural threshold FET device as an AND gate enables the propagation of a signal waveform along the source-drain path with an undiminished voltage amplitude and without the delay which accompanies conventional inverter-type AND gates.

FIG. 2 shows a third AND gate 120C having a first input connected to the complementary output Q*(N+1) 108C of the latch 104C and a second input 126C, and having an output connected to the second input (through the OR gate 114C) of the first AND gate 112C.

FIG. 3 shows the third AND gate 120C being a natural threshold FET device 120'C having its gate connected to the complementary output Q*(N+1) 108C of the latch 104C and its source-drain path connected between the second input 126C and the output 122C thereof. The use of a natural threshold FET device as an AND gate enables the propagation of a signal waveform along the source-drain path with an undiminished voltage amplitude and without the delay which accompanies conventional inverter-type AND gates.

FIG. 2 shows a NOR gate 124C having its output connected to the second input 126C of the third AND gate 120C, and having a plurality of N inputs, each respectively connected to the complementary output Q*(i) 134A or 134B of a corresponding ith latch similar to the latch 104C in the N+1st stage, in each of N lower order ones of the stages 1, 2, . . . , N−1, N.

FIG. 2 shows an OR gate 128C having its output connected to the second input 130C of the second AND gate 116C, and having a plurality of N inputs, each respectively connected to the complementary output Q*(i) 134A or 134B of the corresponding ith latch similar to the latch 104C in the N+1st stage, in each of the N lower order ones of the stages 1, 2, . . . , N−1, N.

As an additional feature in FIG. 3, the NOR gate 124C further includes first depletion mode FET load device 150C connected between a positive reference potential +V and the output 126C of the NOR gate 124C.

The NOR gate 124C further includes a plurality of N enhancement mode FET devices 152C(A) and 152C(B), each having its respective source-drain path connected between the output 126C of the NOR gate 124C and ground potential and each having its respective gate connected to the complementary output Q*(i) 134A or 134B of the corresponding ith latch similar to the latch 104C in the N+1st stage, in each of the N lower order ones of the stages 1, 2, . . . , N−1, N.

A signal delay occurs in the NOR gate 124C due to the necessity to charge or to discharge the output 126C thereof in response to its inputs 134A and 134B from the two lower order stages N−1 and N. However, the binary state of the complementary output Q*(N+1) of the latch 104C is not delayed in this manner. The capacitance of the source-drain path of a natural threshold FET device is less than the capacitance of its gate electrode. This phenomenon is taken advantage of in the connection of the FET 120'C for the third AND gate 120C, so that the lower capacitance source-drain path of FET 120'C is connected to the delayed output 126C of the NOR 124C and the higher capacitance gate of FET 120'C is connected to the lesser delayed complementary output Q*(N+1) from the latch 104C. In this manner, the signals from the NOR gate 124C and from the latch 104C are juxtaposed in time and this contibutes to the high speed operation of the subsequent value decoder 100C.

As an additional feature in FIG. 3, the OR gate 128C further includes a second depletion mode FET load device 154C connected between the ground potential and the output 130C of the OR gate 128C.

The OR gate 128C further includes a plurality of N natural threshold FET devices 156C(A) and 156C(B), each having its respective source-drain path connected between the output of the OR gate 128C and the positive reference potential +V and each having its respective gate connected to the complementary output Q*(i) 134A or 134B of the corresponding ith latch similar to the latch 104C in the N+1st stage, in each of the N lower order ones of the stages 1, 2, . . . , N−1, N.

A signal delay occurs in the OR gate 128C due to the necessity to charge or to discharge the output 130C thereof in response to its inputs 134A and 134B from the two lower order stages N−1 and N. However, the binary state of the true output Q(N+1) of the latch 104C is not delayed in this manner. The capacitance of the source-drain path of a natural threshold FET device is less than the capacitance of its gate electrode. This phenomenon is taken advantage of in the connection of the FET 116'C for the second AND gate 116C, so that the lower capacitance source-drain path of FET 116'C is connected to the delayed output 130C of the OR 128C and the higher capacitance gate of FET 116'C is connected to the lesser delayed true output Q(N+1) from the latch 104C. In this manner, the signals from the OR gate 128C and from the latch 104C are juxtaposed in time and this contributes to the high speed operation of the subsequent value decoder 100C.

OPERATION OF THE INVENTION AS AN UP-COUNTER

The following is an example of the operation of the counter invention when connected as an up-counter as shown in FIGS. 1 and 2. Assume that the counter of FIG. 1 is storing the current binary number "1011", which has the numeric value of eleven, that is bit "A"=1, bit "B"=1, bit"C"=0 and bit "D"=1. A positive logic convention will be employed in this description, where a more positive potential is considered to represent a binary "1" and a less positive potential is considered to represent a binary "0". Since the counter is configured as an up-counter with the shorted connections 136A, 136B, 136C and 136D in place in all four stages, the binary values on the lines 134A to 134D are 134A=0, 134B=0, 134C=1, 134D=0.

As is seen in FIG. 2 for the stage N=1, the inputs 134A and 134B to the NOR 124C are both a binary "0" and thus the output 126C is a binary "1". The output of the OR 128C is a binary "0". Since the complementary output Q*(N+1) of the latch 104C is a binary "1", the third AND gate 120C is satisfied and outputs a binary "1" to the AND gate 112C. Referring to the circuit diagram of FIG. 3, a signal delay occurs in the NOR gate 124C due to the necessity to charge or to discharge the output 126C thereof in response to its inputs 134A and 134B from the two lower order stages N−1 and N. However, the binary state of the complementary output Q*(N+1) of the latch 104C is not delayed in this manner. The capacitance of the source-drain path of the natural threshold FET device 120'C is less than the capacitance of its gate electrode. This is taken advantage of in the connection of the Fet 120'C for the third AND gate 120C, so that the lower capacitance source-drain path of FET 120'C is connected to the delayed output 126C of the NOR 124C and the higher capacitance gate of FET 120'C is connected to the lesser delayed complementary output Q*(N+1) from the latch 104C. In this manner, the signals from the NOR gate 124C and from the latch 104C are effective at substantially the same time in the AND gate 120C and this speeds the propagation of the signal to the node 114'C to await the occurance of the next positive input pulse to be counted at input terminal 110.

When the next pulse is input at 110, the FET device 112'C passes the binary "1" value from node 114'C to the (D) input of the latch 104C, thereby switching the stored state of the latch 104C to a binary "1" value. Simultaneously, the lowest significant bit latch 104A in the stage N−1 switches its stored state to a binary "0" and the next latch 104B in stage N switches its stored state to a binary "0". The binary state of stage N+2 remains unchanged in this example. Thus the new stored binary value in the counter, after the occurance of the pulse at input 110, is bit "A"=0, bit "B"=0, bit "C"=1 and bit "D"=1, which is the numeric value twelve.

ALTERNATE EMBODIMENT WITH SELECTIVE UP OR DOWN COUNTING

FIG. 4 is a logic diagram of the up-down select logic which can be substituted in 136C in FIG. 2 and 136A in FIG. 1. The logic of FIG. 4 can be used in association with each subsequent value decoder in FIG. 1 to enable the selective setting of the counter as either an up-counter or a down-counter. FIG. 5 is a circuit diagram of the up-down select logic of FIG. 4.

The up-down select logic uses a control signal referred to as "count up" and its complement signal "count down", which are respectively input to the AND gate 140C and to the AND gate 142C, in FIG. 4. The true value output Q(N+1) at 106C is apppplied as the other input to the AND gate 142C the output of which is applied to the OR gate 144C. The complementary value output Q*(N+1) at 132C is applied as the other input to the AND gate 140C the output of which is applied to the OR gate 144C. Thus the logic circuit of FIG. 4 is substituted for the shorted connection 136C in FIG. 2 and for the shorted connection 136A in FIG. 1.

FIG. 5 shows that the AND gate 140C is embodied as the natural threshold FET device 140'C and that the AND gate 142C is embodied as the natural threshold FET device 142'C. The use of a natural threshold FET device as an AND gate enables the propagation of a signal waveform along the source-drain path with an undiminished voltage amplitude and without the delay which accompanies conventional inverter-type AND gates. The OR gate 144C is embodied as the common node 144'C.

If the counter of FIG. 1 is to count in a decreasing sequence as a down-counter, then the binary value of the variable "count down" will be "1" and the AND gate 142C will pass the true value Q(N+1) which is output on line 134C. If the counter of FIG. 1 is to count in an increasing sequence as an up-counter, then the binary value fo the variable "count up" will be "1" and the AND gate 140C will pass the complementary value Q*(N+1) which is output on line 134C. Corresponding operations will occur at each of the four stages in the counter of FIG. 1, thereby enabling the selective application of the counter as either an up-counter or as a down-counter.

Although a specific embodiment of the invention has been disclosed, it will be understood by those having skill in the art that the forgoing and other changes in form and details may be made therein without departing from the spirit and the scope of the invention.

What is claimed is:

1. In an M-bit binary counter having M sequentially ascending binary value stages, the first stage being the lowest significant bit, a subsequent value decoder in a N+1st stage (where N is an integer and 0<N<M), comprising:
   a first AND gate having a first input connected to a system input to be counted and a second input, and having an output;
   said first AND gate being a natural threshold FET device having its gate connected to said system input and its source-drain path connected between said second input and said output thereof;
   a latch having an input connected to said output of said first AND gate and having a true output Q(N+1) and a complementary output Q*(N+1), for storing the current binary state of said N+1st stage;
   a second AND gate having a first input connected to said true output Q(N+1) of said latch and a second input, and having an output connected to second input of said first AND gate;
   said second AND gate being a natural threshold FET device having its gate connected to said true output Q(N+1) of said latch and its source-drain path connected between said second input and said output thereof;
   a third AND gate having a first input connected to said complementary output Q*(N+1) of said latch and a second input and having an output connected to said second input of said first AND gate;
   said third AND gate being a natural threshold FET device having its gate connected to said complementary output Q*(N+1) of said latch and its source-drain path connected between said second input and said output thereof;
   a NOR gate having its output connected to said second input of said third AND gate, and having a plurality of N inputs, each respectively connected to the complementary output Q*(i) of a corresponding ith latch similar to said latch in said N+1st stage, in each of N lower order ones of said stages;
   an OR gate having its output connected to said second input of said second AND gate, and having a plurality of N inputs, each respectively connected to the complementary output Q*(i) of said corresponding ith latch similar to said latch in said N+1st stage, in each of said N lower order ones of said stages;
   whereby the effect of lower order carry bits on higher order stages can be quickly decoded with a minimum of signal delay.

2. The apparatus of claim 1, wherein said NOR gate further comprises:
   a first depletion mode FET load device connected between a positive reference potential and said output of said NOR gate;
   a plurality of N enhancement mode FET devices each having its respective source-drain path connected between said output of said NOR gate and ground potential and each having its respective gate connected to said complementary output Q*(i) of said corresponding ith latch similar to said latch in said N+1st stage, in each of said N lower order ones of said stages.

3. The apparatus of claim 2, wherein said OR gate further comprises:
   a second depletion mode FET load device connected between said ground potential and said output of said OR gate;
   a plurality of N natural threshold FET devices, each having its respective source-drain path connected between said output of said OR gate and said positive reference potential and each having its respective gate connected to said complementary output Q*(i) of said corresponding ith latch similar to said latch in said N+1st stage, in each of said N lower order ones of said stages.

4. The apparatus of claim 1, which further comprises:
   an up-down logic means having inputs connected to said true output Q(N+1) and said complementary output Q*(N+1) of said latch, and having a control input, and having an output connected to a NOR gate and to an OR gate in an N+2nd higher order one of said stages, respectively corresponding to said NOR gate and said OR gate in said N+1st stage, for selectively outputting either Q*(N+1) or Q(N+1) to operate said counter as an up counter or alternately as a down counter in response to said control input.

5. In an M-bit binary counter having M sequentially ascending binary value stages, the first stage being the lowest significant bit, a subsequent value decoder in a N+1st stage (where N is an integer and 0<N<M), comprising:
   a first AND gate having a first input connected to a system input to be counted and a second input, and having an output; said first AND gate being a natural threshold FET device having its gate connected to said system input and its source-drain path connected between said second input and said output thereof;

a latch having an input connected to said output of said first AND gate and having a true output Q(N+1) and a complementary output Q*(N+1), for storing the current binary state of said N+1st stage;

a second AND gate having a first input connected to said true output Q(N+1) of said latch and a second input, and having an output connected to said second input of said first AND gate;

said second AND gate being a natural threshold FET device having its gate connected to said true output Q(N+1) of said latch and its source-drain path connected between said second input and said output thereof;

a third AND gate having a first input connected to said complementary output Q*(N+1) of said latch and a second input and having an output connected to said second input of said first AND gate;

said third AND gate being a natural threshold FET device having its gate connected to said complementary output Q*(N+1) of said latch and its source-drain path connected between said second input and said output thereof;

a NOR gate having its output connected to said second input of said third AND gate, and having a plurality of N inputs, each respectively connected to the true output Q(i) of a corresponding ith latch similar to said latch in said N+1st stage, in each of N lower order ones of said stages;

an OR gate having its output connected to said second input of said second AND gate, and having a plurality of N inputs, each respectively connected to the true output Q(i) of said corresponding ith latch similar to said latch in said N+1st stage, in each of said N lower order ones of said stages;

whereby the effect of lower order carry bits on higher order stages can be quickly decoded with a minimum of signal delay.

6. The apparatus of claim 5, wherein said NOR gate further comprises:

a first depletion mode FET load device connected between a positive reference potential and said output of said NOR gate;

a plurality of N enhancement mode FET devices each having its respective source-drain path connected between said output of said NOR gate and ground potential and each having its respective gate connected to said true output Q(i) of said corresponding ith latch similar to said latch in said N+1st stage, in each of said N lower order ones of said stages.

7. The apparatus of claim 6, wherein said OR gate further comprises:

a second depletion mode FET load device connected between said ground potential and said output of said OR gate;

a plurality of N natural threshold FET devices, each having its respective source-drain path connected between said output of said OR gate and said positive reference potential and each having its respective gate connected to said true output Q(i) of said corresponding ith latch similar to said latch in said N+1st stage, in each of said N lower order ones of said stages.

8. The apparatus of claim 5, which further comprises:

an up-down logic means having inputs connected to said true output Q(N+1) and said complementary output Q*(N+1) of said latch, and having a control input, and having an output connected to a NOR gate and to an OR gate in an N+2nd higher order one of said stages, respectively corresponding to said NOR gate and said OR gate in said N+1st stage, for selectively outputting either Q*(N+1) or Q(N+1) to operate said counter as an up counter or alternately as a down counter, respectively, in response to said control input.

* * * * *

UNITED STATES PATENT AND TRADEMARK OFFICE
CERTIFICATE OF CORRECTION

PATENT NO. : 4,637,038

DATED : Jan. 13, 1987

INVENTOR(S) : David H. Boyle

It is certified that error appears in the above-identified patent and that said Letters Patent is hereby corrected as shown below:

Column 8, line 9 - Change "N=1," to --N+1,--.

Signed and Sealed this

Twenty-first Day of April, 1987

Attest:

DONALD J. QUIGG

Attesting Officer

Commissioner of Patents and Trademarks